United States Patent
Hsu

(10) Patent No.: US 6,643,136 B2
(45) Date of Patent: Nov. 4, 2003

(54) MULTI-CHIP PACKAGE WITH EMBEDDED COOLING ELEMENT

(75) Inventor: Chi-Hsing Hsu, Taipei Hsien (TW)

(73) Assignee: Via Technolgies, Inc., Taipei Hsien (TW)

(*) Notice: Subject to any disclaimer, the term of this patent is extended or adjusted under 35 U.S.C. 154(b) by 0 days.

(21) Appl. No.: 10/122,897

(22) Filed: Apr. 11, 2002

(65) Prior Publication Data

US 2003/0112604 A1 Jun. 19, 2003

(30) Foreign Application Priority Data

Dec. 18, 2001 (TW) .................................. 90131288 A

(51) Int. Cl.[7] .............................................. H05K 7/20
(52) U.S. Cl. ...................... 361/719; 257/675; 257/796; 361/704
(58) Field of Search ................ 257/675, 796, 257/706, 707, 713, 720, 723, 724, 778; 174/16.3, 252, 52.2; 165/80.3, 185; 361/704, 705, 707–712, 717–719

(56) References Cited

U.S. PATENT DOCUMENTS

| | | | |
|---|---|---|---|
| 6,246,115 B1 | * | 6/2001 | Tang et al. ................. 257/706 |
| 6,316,822 B1 | * | 11/2001 | Venkateshwaran et al. . 257/666 |
| 6,429,513 B1 | * | 8/2002 | Shermer, IV et al. ........ 257/714 |
| 6,472,743 B2 | * | 10/2002 | Huang et al. ................ 257/717 |
| 6,507,107 B2 | * | 1/2003 | Vaiyapuri .................... 257/723 |
| 6,528,882 B2 | * | 3/2003 | Ding et al. .................. 257/738 |
| 2002/0079567 A1 | * | 6/2002 | Lo et al. | |
| 2002/0185734 A1 | * | 12/2002 | Zhao et al. | |
| 2003/0047798 A1 | * | 3/2003 | Halahan | |
| 2003/0057545 A1 | * | 3/2003 | Shim et al. | |

* cited by examiner

Primary Examiner—Gerald Tolin
(74) Attorney, Agent, or Firm—J.C. Patents

(57) ABSTRACT

A multi-chip package having one or more embedded cooling elements. The package includes a substrate, a plurality of chips, at least one cooling element, a plurality of solder balls and packaging material. The substrate has a front surface and a corresponding back surface. The chip is attached to the front surface of the substrate and electrically connected to the substrate. At least one cooling element is attached to the chips through thermal glue. The solder balls are attached to the back surface of the substrate. The packaging material encloses the substrate, the chips and the cooling elements.

6 Claims, 6 Drawing Sheets

MULTI-CHIP PACKAGE WITH EMBEDDED COOLING ELEMENT

CROSS-REFERENCE TO RELATED APPLICATION

This application claims the priority benefit of Taiwan application Ser. No. 90131288, filed Dec. 18, 2001.

BACKGROUND OF THE INVENTION

1. Field of Invention

The present invention relates to a package with cooling element therein. More particularly, the present invention relates to a multi-chip package with one or more cooling elements therein.

2. Description of Related Art

In this information explosion era, electronic products are used everywhere. Due to the rapid progress in the electronic industry, innovative multi-functional personalized electronic products are come out in the market almost daily. Most electronic products are designed with the least material, the smallest dimensions and the least weight in mind. Despite the fast development of powerful miniaturized electronic products, cooling is still a major problem.

To reduce size and weight and increase functional capacity of electronic products, more than one chip is often embedded inside a single package. FIG. 1 is a schematic cross-sectional view of a multi-chip module (MCM). As shown in FIG. 1, the multi-chip module 100 includes a plurality of chips 140, a substrate 110, a plurality of conductive wires 150, a plurality of solder balls 190 and packaging material 180 for enclosing the chips 140 and wires 150. The substrate 110 has a front surface 112 and a back surface 122. The front surface 112 of the substrate 110 also has a plurality of die pads 114 and a plurality of wire contacts 116. The wire contacts are positioned on the front surface 112 around the die pads 114. The substrate further includes a plurality of solder ball contacts 124 on the back surface 122. Each chip 140 has an active surface 142 and a back surface 148. The active surface 142 of the chip 140 further includes a plurality of bonding pads 144. The back surface 148 of the chip 140 is attached to the die pad 114 of the substrate 110. One end of each conductive wire 150 is in electrical contact with a bonding pad 144 while the other end of the conductive wire 150 is in electrical contact with the wire contact 116. The packaging material 180 encloses the substrate 110, the chips 140 and the conductive wires 150. The solder balls 190 are attached to the respective solder ball contacts 124.

In the aforementioned multi-chip module 100, all chips 140 are embedded inside the packaging material 180. Since each chip contributes some heat to the package during operation, the tight packaging of chips 140 inside the module may lead to considerable heat dissipation problem relative to a single chip package. If the heat is not channeled away fast enough, the entire module may overheat resulting in chip malfunction. Hence, increasing heat-dissipating capacity is always a central issue in the production of multi-chip modules.

SUMMARY OF THE INVENTION

Accordingly, one object of the present invention is to provide a multi-chip package with embedded cooling elements for rapidly dissipating heat generated by various chips away from the package.

To achieve these and other advantages and in accordance with the purpose of the invention, as embodied and broadly described herein, the invention provides a multi-chip package having one or more embedded cooling elements. The multi-chip package includes a substrate, a plurality of chips, at least one cooling element, a plurality of solder balls and packaging material. The substrate has a front surface and a corresponding back surface. The chips are attached to the front surface of the substrate and are electrically connected to the substrate. The cooling element is attached to at least one of the chips. The cooling element is fastened to the chip through thermal conductive glue. The solder balls are attached to the back surface of the substrate. The packaging material encloses the substrate, the chips and the cooling elements. According to the embodiment of this invention, a portion of the cooling element may be exposed by the packaging material or entirely embedded within the packaging material.

This invention also provides a second multi-chip package having one or more embedded cooling elements. The multi-chip package includes a lead frame, at least one first chip, at least one second chip and at least one cooling element and packaging material. The lead frame includes a die pad and a plurality of leads. The leads surround the die pad. The die pad has a die pad surface that corresponds to the backside of a chip. Each lead is further divided into an inner lead section and an outer lead section. The first chip is attached to the front surface of the die pad and electrically connected to some of leads. The second chip is attached to the back surface of the die pad and electrically connected to some other leads. The cooling element is attached to the upper surface of the first chip or the second chip. The cooling elements are bonded to the upper surface of the chip through thermal conductive glue. The packaging material encloses the die pad, the first chip, the second chip, the inner lead sections and the cooling elements. The outer lead sections of the leads are exposed. According to the embodiment of this invention, a portion of the cooling element may be exposed by the packaging material or entirely embedded within the packaging material.

Each multi-chip package encloses at least two chips. Hence, the package has considerable data processing power to meet future developmental demands. Moreover, the placement of cooling elements over all or some of the chips increases the heat-dissipating power of the package and reduces chip failure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
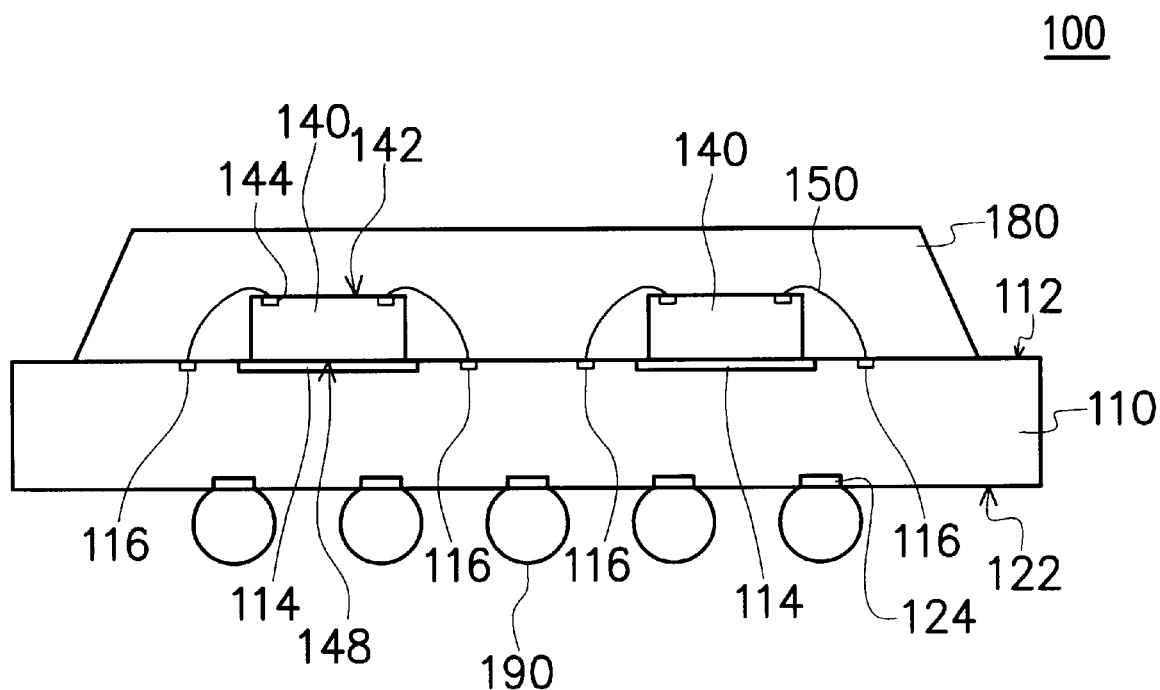
FIG. 1 is a schematic cross-sectional view of a multi-chip module.

Reference will now be made in detail to the present preferred embodiments of the invention, examples of which are illustrated in the accompanying drawings. Wherever possible, the same reference numbers are used in the drawings and the description to refer to the same or like parts.

Figure 2:
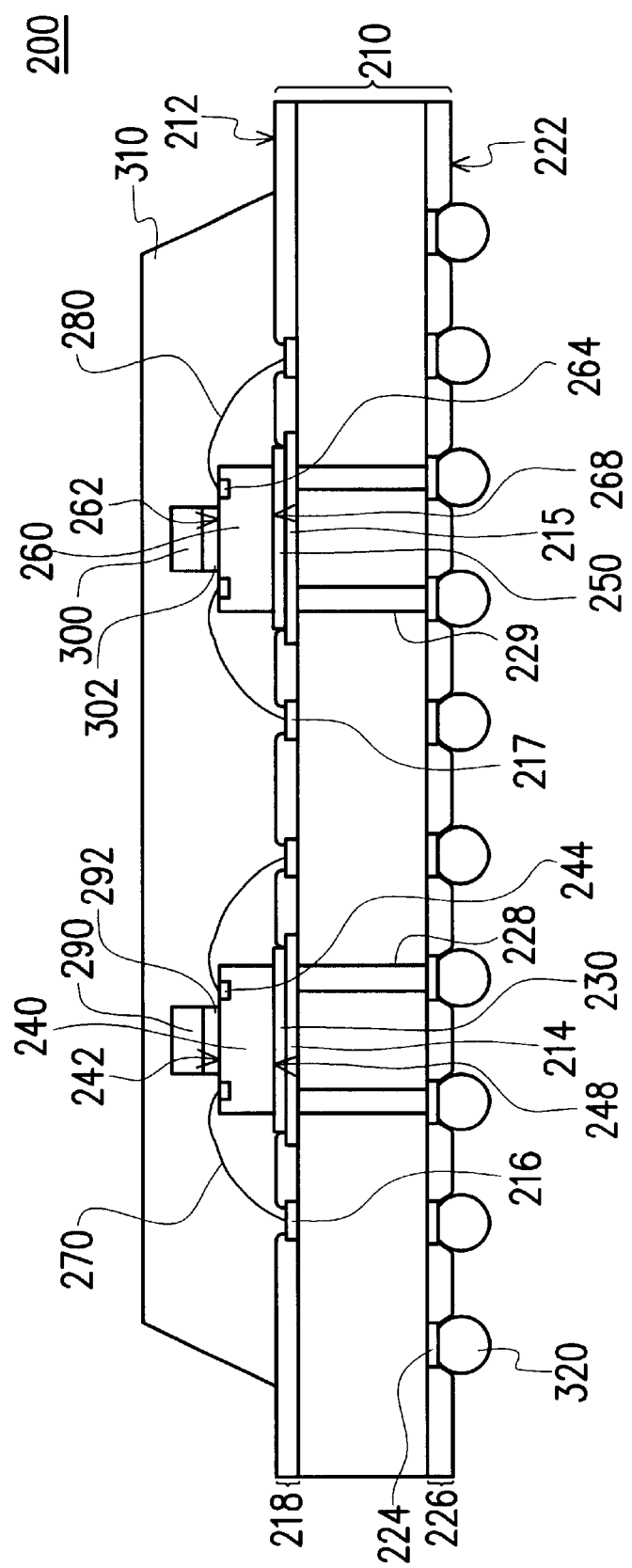
FIG. 2 is a schematic cross-sectional view of a multi-chip package having embedded cooling elements according to a first preferred embodiment of this invention.

FIG. 2 is a schematic cross-sectional view of a multi-chip package having embedded cooling elements according to a first preferred embodiment of this invention. As shown in FIG. 2, the package 200 includes a substrate 210, a first chip 240, a second chip 260, a first cooling element 290, a second cooling element 300, some packaging material 310, a plurality of solder balls 320, a plurality of first chip conductive wires 270 and a plurality of second chip conductive wires 280.

The substrate 210 has a front surface 212 and a corresponding back surface 222. The front surface 212 of the substrate 210 further includes a first die pad 214, a second die pad 215, a plurality of first chip wire contacts 216, a plurality of second chip wire contacts 217 and a first solder mask 218. The first chip wire contacts 216 surrounds the first die pad 214 and the second chip wire contacts 215 surrounds the second die pad 217. The first solder mask 218 exposes the first die pad 214, the second die pad 215, the first chip wire contacts 216 and the second chip wire contacts 217. The back surface 222 of the substrate 210 further includes a plurality of solder ball contacts 224 and a second solder mask 226. The second solder mask 226 exposes the solder ball contacts 224. The substrate 210 further includes a plurality of conductive plugs 228 and a plurality of second conductive plugs 229 that puncture through the substrate 210 vertically. The first conductive plugs 228 and the first die pad 214 are connected. Similarly, the second conductive plugs 229 and the second die pad 215 are connected. Hence, heat transferred to the first die pad 214 and the second die pad 215 is rapidly channeled away via the first conductive plug 228 or the second conductive plug 229 respectively.

The first chip 240 has a first active surface 242 and a corresponding back surface 248. The active surface 242 of the first chip 240 further includes a plurality of first bonding pads 244. The back surface 248 of the first chip 240 is attached to the first die pad 214 using thermal glue 230. The second chip 260 has an active surface 262 and a corresponding back surface 268. The active surface 262 of the second chip 260 further includes a plurality of second bonding pads 264. The back surface 268 of the second chip 260 is attached to the second die pad 215 using thermal glue 250.

One end of the first chip conductive wires 270 is electrically connected to the first chip bonding pads 244 while the other end of the first conductive wires 270 are electrically connected to the first chip wire contacts 216. Similarly, one end of the second chip conductive wires 280 are electrically connected to the second chip bonding pads 264 while the other end of the second conductive wires 280 are electrically connected to the second chip wire contacts 217.

The first cooling element 290 has a planar profile. The first cooling element 290 is attached to the active surface 242 of the first chip 240 using thermal glue 292. Similarly, the second cooling element 300 also has a planar profile. The second cooling element 300 is attached to the active surface 262 of the second chip 260 using thermal glue 302. The first cooling element 290 and the second cooling element 300 can be made from a material including copper, aluminum, silicide or silicon. Since the first chip 240 and the second chip 260 are both made from silicon or silicide material, fabricating the first cooling element 290 or the second cooling element 300 with silicon or silicide material has the advantage of eliminating stress resulting from a difference in thermal expansion.

In addition, some packaging material 310 encloses the substrate 210, the first chip 240, the second chip 260, the first chip conductive wires 270, the second chip conductive wires 280, the first cooling element 290 and the second cooling element 300. Furthermore, solder balls 320 are attached to the solder ball contacts 224.

The aforementioned package 200 encloses two chips 240 and 260. Hence, the package has considerable information processing power to meet future demands. Moreover, attachment of the first cooling element 290 and the second cooling element 300 directly onto the active surface 242 of the first chip 240 and the active surface 262 of the second chip 260 enhances the heat-dissipating power of the package and reduces chip failure. Furthermore, if a fan (not shown) is mounted over the package 200 to increase air circulation, heat is removed from the first chip 240 and the second chip 260 even faster.

Figure 3:
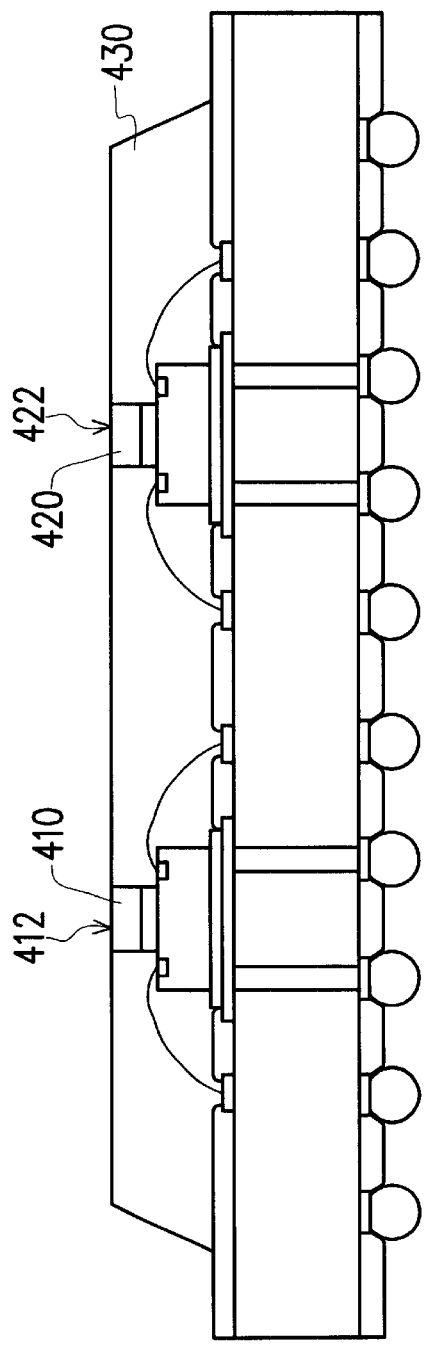
FIG. 3 is a schematic cross-sectional view of a multi-chip package having embedded cooling elements according to a second preferred embodiment of this invention.

In the first embodiment, the cooling element is entirely buried inside the package. However, the cooling element may be exposed outside the package. FIG. 3 is a schematic cross-sectional view of a multi-chip package having embedded cooling elements according to a second preferred embodiment of this invention. As shown in FIG. 3, the packaging material 430 only surrounds the lower and peripheral portion of the first cooling element 410 and the second cooling element 420. The upper surface 412 of the first cooling element 410 and the upper surface 422 of the second cooling element 420 are exposed.

Figure 4:
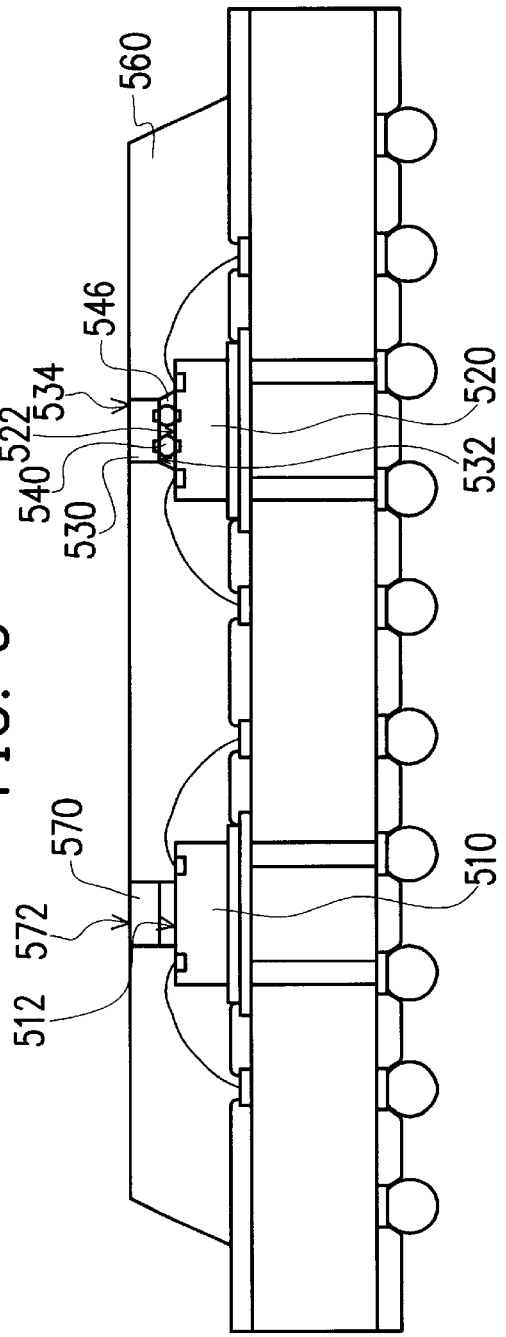
FIG. 4 is a schematic cross-sectional view of a multi-chip package having embedded cooling elements according to a third preferred embodiment of this invention.

In the first embodiment, the cooling elements are attached to the active surface of the chips. However, this is by no means the only method of attachment. In fact, another chip may be attached to the active surface of the chip. FIG. 4 is a schematic cross-sectional view of a multi-chip package having embedded cooling elements according to a third preferred embodiment of this invention. As shown in FIG. 4, a cooling element 570 is attached to the active surface 512 of the first chip 510. The upper surface 572 of the cooling element 570 is exposed outside the packaging material 560. A third chip 530 is attached to the active surface 522 of a second chip 520. The active surface 532 of the third chip 530 faces the active surface 522 of the second chip 520. The third chip 530 and the second chip 520 are electrically connected via a plurality of bumps 540 between the third chip 530 and the second chip 520. Filler material 546 fills up the space between the active surface 522 of the second chip 520 and the active surface 532 of the third chip 530 and encloses the bumps 540 as well. The back surface 534 of the third chip 530 is exposed outside the packaging material 560. However, the cooling element 570 and the third chip 530 may be entirely enclosed within the packaging material.

Figure 5:
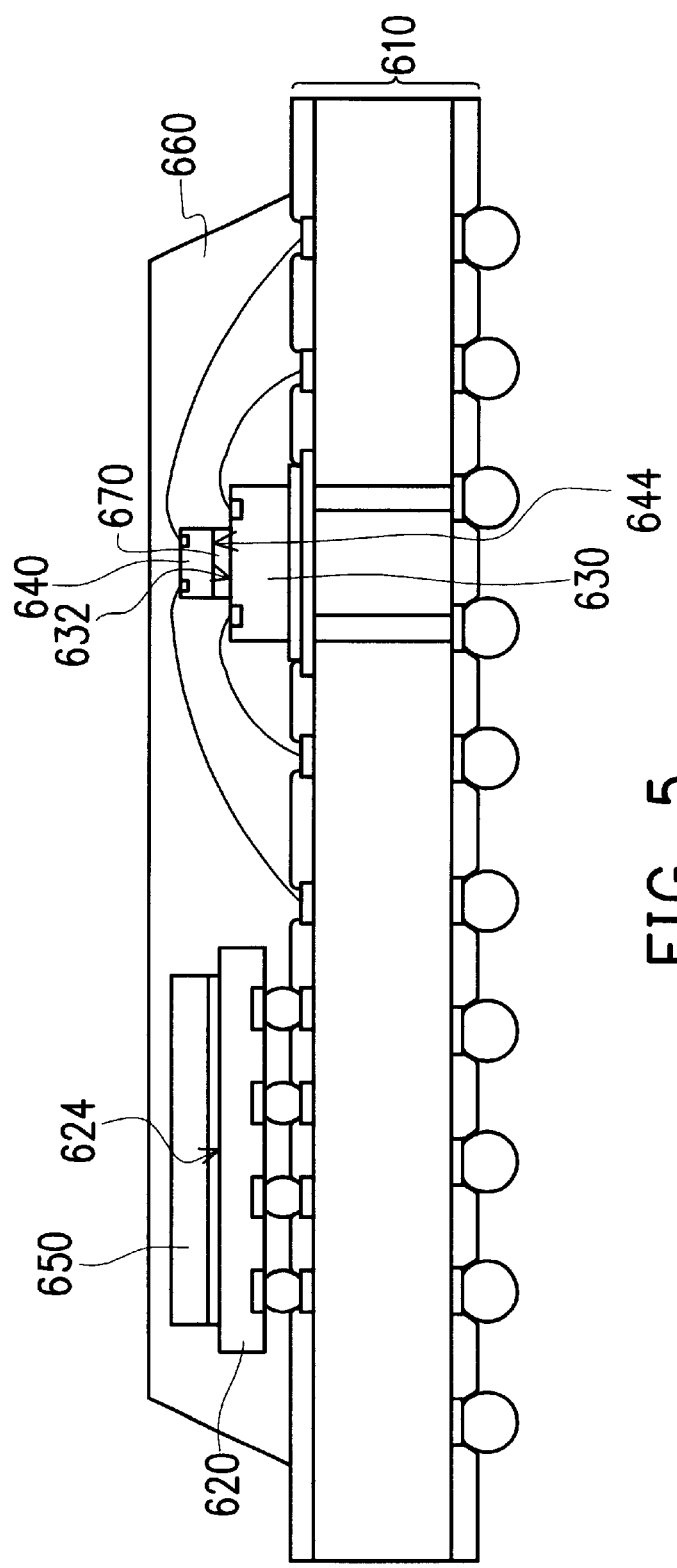
FIG. 5 is a schematic cross-sectional view of a multi-chip package having embedded cooling elements according to a fourth preferred embodiment of this invention.

FIG. 5 is a schematic cross-sectional view of a multi-chip package having embedded cooling elements according to a fourth preferred embodiment of this invention. As shown in FIG. 5, the first chip 620 and the substrate 610 are electrically connected together as a flip-chip. The second chip 630 and the substrate 610 are electrically connected together by wire bonding. A cooling element 650 is attached to the back surface 624 of the first chip 620. The entire cooling element 650 is enclosed within the packaging material 660. A third chip 640 is attached to the active surface 632 of the second chip 630. The back surface 644 of the third chip 640 is attached to the active surface 632 of the second chip 630 by thermal glue 670. The third chip 640 and the substrate 610 are electrically connected together by wire bonding. In the fourth embodiment, the upper surface of the cooling element 650 may also be exposed outside the packaging material 660.

Figure 6:
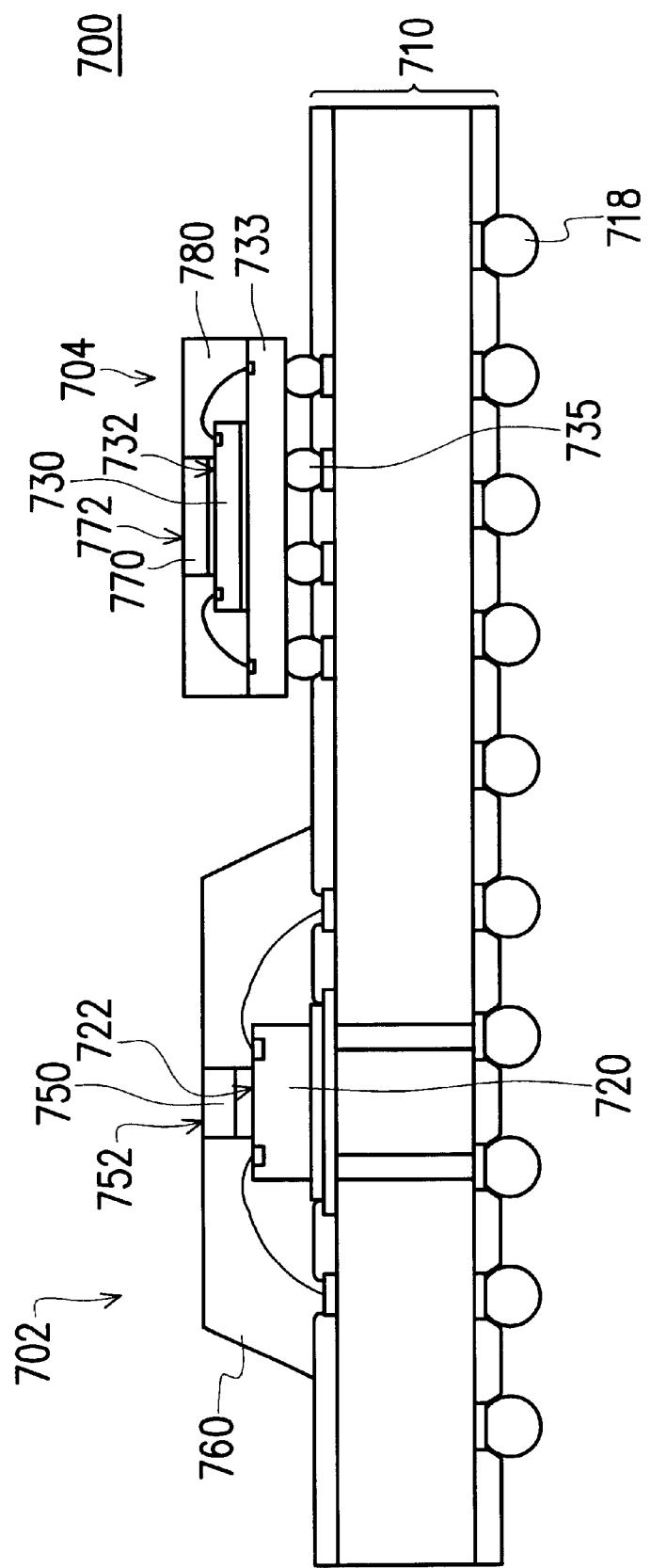
FIG. 6 is a schematic cross-sectional view of a multi-chip package having embedded cooling elements according to a fifth preferred embodiment of this invention.

FIG. 6 is a schematic cross-sectional view of a multi-package-module (MPM) having embedded cooling elements according to a fifth preferred embodiment of this invention. As shown in FIG. 6, a first package 702 and a second package 704 are formed over a substrate 710. In the first package 702, a first chip 720 is electrically connected to the substrate 710 by wire bonding. A first cooling element 750 is attached to the active surface 722 of the first chip 720. The upper surface 752 of the cooling element 750 is exposed outside the packaging material 760. In the second package 704, a second chip 730 is formed over a sub-substrate 733. The second chip 730 and the sub-substrate 733 are electrically connected together by wire bonding. A second cooling element 770 is attached to the active surface 732 of the second chip 730. The upper surface 772 of the second cooling element 770 is exposed outside the packaging material 780. The back surface of the sub-substrate 733 has a plurality of sub-solder balls 735. The second package 704 is electrically connected to the substrate 710 through the sub-solder balls 735. After mounting the first chip 720 and the second chip 730 on the substrate 710, the multi-chip module 700 may be electrically connected to a printed circuit board (not shown) via solder balls 718 on the lower surface of the substrate 710. In the aforementioned package, the first cooling element 750 and the second cooling element 770 may also be entirely buried inside the packaging material 760.

Figure 7:
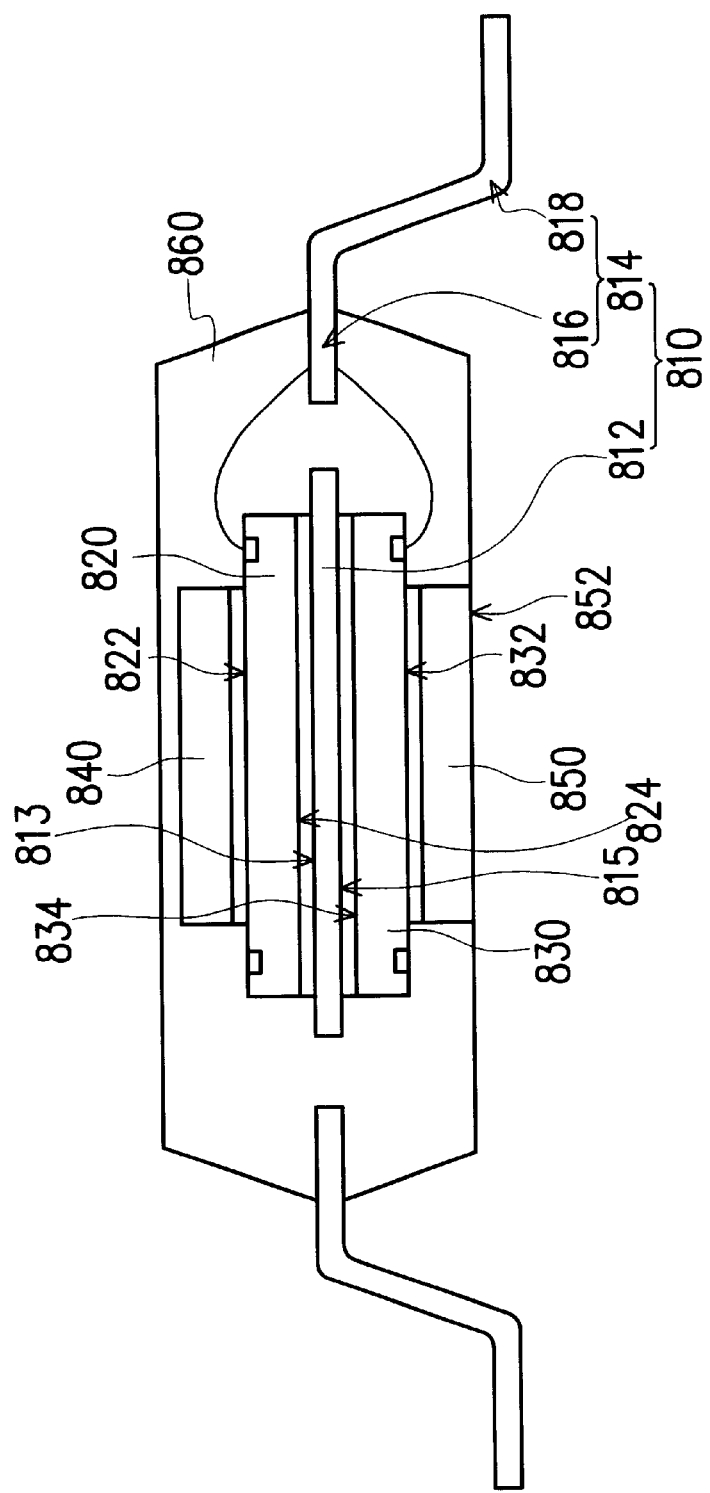
FIG. 7 is a schematic cross-sectional view of a multi-chip package having embedded cooling elements according to a sixth preferred embodiment of this invention.

In the fifth embodiment, the substrate serves as a carrier to support a plurality of chips. However, a lead frame may also be used as the carrier for supporting a plurality of chips inside a package. FIG. 7 is a schematic cross-sectional view of a multi-chip package having embedded cooling elements according to a sixth preferred embodiment of this invention. A lead frame 810 having a die pad 812 and a plurality of leads 814 is shown in FIG. 7. The leads 814 are formed around the die pad 812. The die pad 812 has a front surface 813 and a corresponding back surface 815. Each lead 814 is further divided into an inner lead section 816 and an outer lead section 818. The backside 824 of a first chip 820 is attached to the front surface 813 of the die pad 812. The backside 834 of a second chip 830 is attached to the back surface 815 of the die pad 812. Both the first chip 820 and the second chip 830 are electrically connected to various leads 814 by wire bonding. A first cooling element 840 is attached to the active surface 822 of the first chip 820. Similarly, a second cooling element 850 is attached to the active surface 832 of the second chip 830. Packaging material 860 encloses the first chip 820, the second chip 830, the first cooling element 840, the second cooling element 850, the die pad 812 and the inner lead sections 816 of the leads 814. The outer lead sections 818 of the leads 814 are exposed outside the packaging material 860. The first cooling element 840 is completely surrounded by the packaging material 860. The upper surface 852 of the second cooling element 850 is exposed outside the packaging material 860. However, in the aforementioned package, the upper surface of the first cooling element 840 can be exposed outside the packaging material 860 while the second cooling element 850 is completely buried inside the packaging material 860.

All the aforementioned embodiments of this invention may be applied to a package with two or more than two chips. In addition, the cooling elements may be fabricated using material such as copper, aluminum, silicate or silicon.

In summary, the multi-chip package structure fabricated according to this invention encloses at least two chips and hence has considerable information processing power to meet future developmental demands. The placement of cooling elements over all or some of the chips increases the heat-dissipating power of the package and reduces chip failure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip package having at least one embedded cooling element, comprising:

a substrate having a front surface and a back surface;

a plurality of packages on the front surface of the substrate with each package having at least a chip enclosed by a packaging material, wherein at least one package contains a cooling element attached to the chip through thermal glue, wherein at least one of the packages further includes a sub-substrate having a front surface and a back surface, wherein at least one chip is attached to the front surface of the sub-substrate, and the sub-substrate is electrically connected to the substrate and a plurality of sub-solder balls attached to the back surface of the sub-substrate, wherein the package with the sub-substrate is positioned over the front surface of the substrate and electrically connected to the substrate through the sub-solder balls; and a plurality of solder balls attached to the back surface of the substrate.

2. The multi-chip package of claim 1, wherein the chip within at least one of the packages is electronically connected to the substrate by wire bonding.

3. The multi-chip package of claim 1, wherein the chip within least one of the packages is electronically connected to the substrate by forming a flip-chip structure.

4. The multi-chip package of claim 1, wherein material constituting the cooling elements is selected from a group consisting of copper, aluminum, silicide and silicon.

5. The multi-chip package of claim 1, wherein a portion of the surface of at least one cooling element is exposed outside the packaging material.

6. The multi-chip package of claim 1, wherein at least one cooling element is entirely enclosed within the package by the packaging material.

* * * * *